United States Patent
Hur et al.

(10) Patent No.: US 10,056,864 B2
(45) Date of Patent: Aug. 21, 2018

(54) EFFICIENT WIDEBAND ENVELOPE TRACKING POWER AMPLIFIER

(71) Applicant: QUALCOMM Incorporated, San Diego, CA (US)

(72) Inventors: Joonhoi Hur, San Diego, CA (US); Paul Draxler, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 15/404,748

(22) Filed: Jan. 12, 2017

(65) Prior Publication Data

US 2018/0198416 A1    Jul. 12, 2018

(51) Int. Cl.
*H03F 1/02* (2006.01)
*H03F 3/193* (2006.01)
*H03F 3/21* (2006.01)

(52) U.S. Cl.
CPC .......... *H03F 1/0238* (2013.01); *H03F 3/193* (2013.01); *H03F 3/21* (2013.01); *H03F 2200/102* (2013.01); *H03F 2200/451* (2013.01)

(58) Field of Classification Search
CPC .................................................... H03F 1/0238
USPC ................................................ 330/136, 297
See application file for complete search history.

(56) References Cited

U.S. PATENT DOCUMENTS

| 7,723,969 | B1 * | 5/2010 | Li | G05F 1/565 323/273 |
|---|---|---|---|---|
| 7,915,961 | B1 | 3/2011 | Li | |
| 8,829,993 | B2 | 9/2014 | Briffa et al. | |
| 8,942,652 | B2 | 1/2015 | Khlat et al. | |
| 9,247,496 | B2 | 1/2016 | Khlat | |
| 9,438,172 | B2 | 9/2016 | Cohen et al. | |
| 9,515,621 | B2 * | 12/2016 | Hietala | H03F 1/0277 |
| 2005/0215209 | A1 | 9/2005 | Tanabe et al. | |
| 2007/0205843 | A1 | 9/2007 | Morimoto et al. | |
| 2008/0297246 | A1 | 12/2008 | Taylor | |

(Continued)

OTHER PUBLICATIONS

Kimball et al., Efficient and Wideband Envelope Amplifiers for Envelope Tracking and Polar Transmitters. 1Electrical and Computer Engineering Department, University of California, San Diego. 2013 IEEE 3 pages.

(Continued)

*Primary Examiner* — Patricia T Nguyen
(74) *Attorney, Agent, or Firm* — Procopio, Cory, Hargreaves & Savitch LLP/Qualcomm (57) ABSTRACT

A wideband envelope tracking power amplifier includes a plurality of low dropout voltage regulators (LDOs) including at least a first LDO and a second LDO. The wideband envelope tracking power amplifier also includes a single-input-multi-output (SIMO) voltage supply to output a plurality of voltage signals at different voltage levels, the voltage levels including a highest voltage level and one or more voltage levels lower than the highest voltage level. The SIMO voltage supply connects a first of the plurality of voltage signals at a first voltage level to the first LDO to form at least a portion of an envelope tracking voltage level signal, and connects a second of the plurality of voltage signals at a second voltage level less than or equal to the first voltage level to the second LDO to form at least another portion of the envelope tracking voltage level signal.

30 Claims, 10 Drawing Sheets

(56) References Cited

U.S. PATENT DOCUMENTS

| | | | | |
|---|---|---|---|---|
| 2013/0127548 A1* | 5/2013 | Popplewell | ........... | H03F 1/0227 |
| | | | | 330/297 |
| 2013/0207731 A1* | 8/2013 | Balteanu | ................... | H03F 1/02 |
| | | | | 330/296 |
| 2014/0057684 A1* | 2/2014 | Khlat | ................ | H04W 52/0209 |
| | | | | 455/574 |
| 2016/0036388 A1* | 2/2016 | Xu | ........................... | H03F 3/19 |
| | | | | 455/571 |
| 2017/0052553 A1* | 2/2017 | Gebeyehu | ............... | G05F 1/575 |

OTHER PUBLICATIONS

International Search Report and Written Opinion—PCT/US2017/066056—ISA/EPO—dated Mar. 20, 2018.

\* cited by examiner

EFFICIENT WIDEBAND ENVELOPE TRACKING POWER AMPLIFIER

BACKGROUND

Field

The present disclosure relates to electronic circuits and, more particularly, to efficient wideband envelope amplifiers for envelope tracking.

Background

A power amplifier is an amplifier designed primarily to increase the power available to a load. In practice, amplifier power gain may depend on the source and load impedances, as well as the voltage and current gain. A wideband amplifier has an amplification factor over a wide frequency range, and is often used to boost signals for relay in communications systems. In general, the power amplifier may be the last amplifier or circuit in a signal chain and is the amplifier stage that may affect power efficiency of the signal chain.

SUMMARY

In one aspect, a wideband envelope tracking power amplifier is provided. The wideband envelope tracking power amplifier includes a plurality of low dropout voltage regulators (LDOs) including at least a first LDO and a second LDO; and a single-input-multi-output (SIMO) voltage supply configured to output a plurality of voltage signals at different voltage levels, the voltage levels including a highest voltage level and one or more voltage levels lower than the highest voltage level. The SIMO voltage supply is further configured to connect a first of the plurality of voltage signals at a first voltage level to the first LDO to form at least a portion of an envelope tracking voltage level signal; and connect a second of the plurality of voltage signals at a second voltage level less than or equal to the first voltage level to the second LDO to form at least another portion of the envelope tracking voltage level signal.

In one aspect, a wideband envelope tracking power amplifier is provided. The wideband envelope tracking power amplifier includes a plurality of low dropout voltage regulators (LDOs) including at least a first LDO and a second LDO; and a single-input-multi-output (SIMO) voltage supply configured to output a plurality of voltage signals at different voltage levels, the voltage levels including a highest voltage level and a plurality of voltage levels lower than the highest voltage level. The first LDO receives a first of the plurality of voltage signals at a first voltage level, the first voltage level being the highest voltage level. The SIMO voltage supply is further configured to connect a second of the plurality of voltage signals at a second voltage level to the second LDO, the second voltage level being less than or equal to the first voltage level. The wideband envelope tracking power amplifier also includes a combiner configured to combine output voltage levels of the first LDO and the second LDO to form an envelope tracking voltage level signal.

In one aspect, a method for operating a wideband envelope tracking power amplifier is provided. The method includes outputting a plurality of voltage signals at different voltage levels, the voltage levels including a highest voltage level and one or more voltage levels lower than the highest voltage level; connecting a first of the plurality of voltage signals at a first voltage level to a first low dropout voltage regulator (LDO); connecting a second of the plurality of voltage signals at a second voltage level to a second LDO, the second voltage level being less than or equal to the highest voltage level; and combining output voltage levels of the first LDO and the second LDO to form an envelope tracking voltage level signal.

In one aspect, a wideband envelope tracking power amplifier is provided. The wideband envelope tracking power amplifier includes a means for outputting a plurality of voltage signals at different voltage levels, the voltage levels including a highest voltage level and a plurality of voltage levels lower than the highest voltage level; a means for connecting a first of the plurality of voltage signals at a first voltage level to a first low dropout voltage regulator (LDO) and for connecting a second of the plurality of voltage signals at a second voltage level less than or equal to the highest voltage level to a second LDO; and a means for combining output voltage levels of the first LDO and the second LDO to form an envelope tracking voltage level signal.

Other features and advantages of the present disclosure should be apparent from the following description which illustrates, by way of example, aspects of the disclosure.

BRIEF DESCRIPTION OF THE DRAWINGS

The details of the present disclosure, both as to its structure and operation, may be gleaned in part by study of the accompanying drawings, in which like reference numerals refer to like parts, and in which.

DETAILED DESCRIPTION

The detailed description set forth below, in connection with the accompanying drawings, is intended as a description of various configurations and is not intended to represent the only configurations in which the concepts described herein may be practiced. The detailed description includes specific details for the purpose of providing a thorough understanding of the various concepts. However, it will be apparent to those skilled in the art that these concepts may be practiced without these specific details. In some instances, well-known structures and components are shown in simplified form in order to avoid obscuring such concepts.

Figure 1:
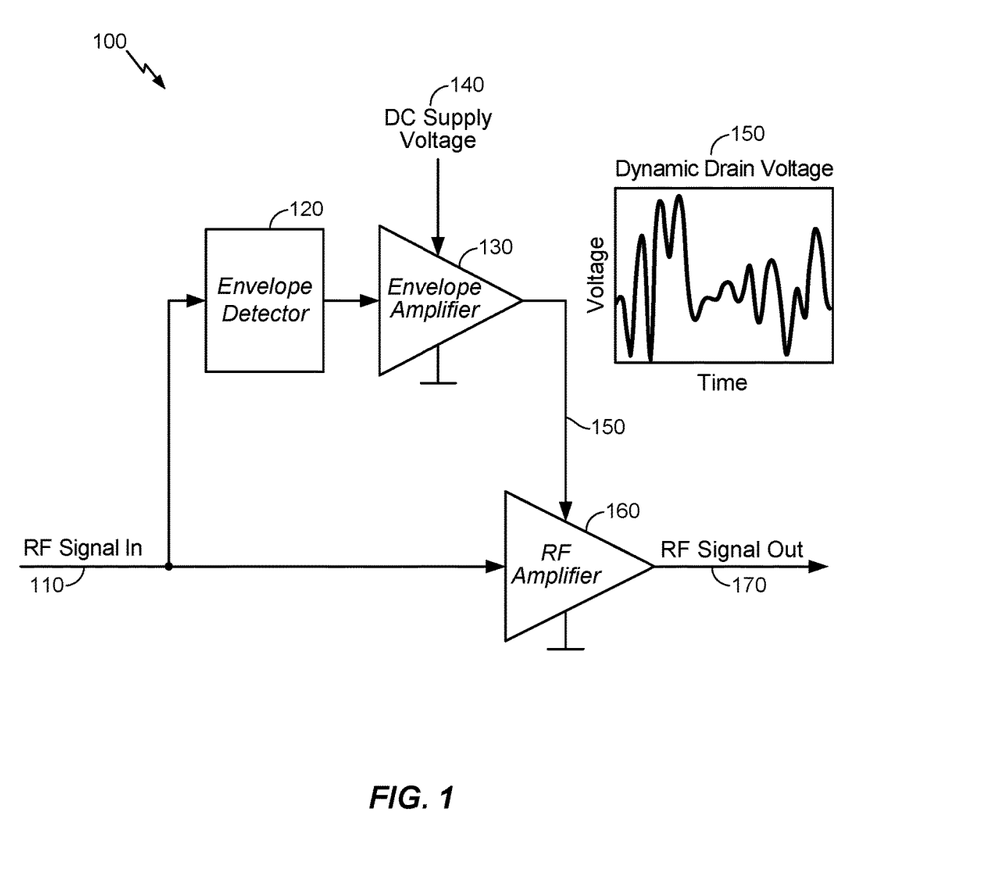
FIG. 1 is a schematic diagram illustrating an exemplary envelope tracking amplifier according to a presently disclosed embodiment.

Envelope tracking can provide for a more efficient system. A radio frequency (RF) power amplifier (PA) may be most efficient when running rail-to-rail using the full swing of the RF PA to create the output waveform. Rail to rail is the maximum voltage range of the RF PA. FIG. 1 is a schematic diagram illustrating an exemplary envelope tracking amplifier 100. Components include an RF Signal In 110, an envelope detector 120, an envelope amplifier 130 provided with a DC supply voltage 140, a dynamic drain voltage 150 that varies versus time, an RF amplifier 160 receiving the dynamic drain voltage 150 and outputs an RF Signal Out 170. The envelope detector 120 receives the RF Signal In 110, performs envelope detection and drives the envelope amplifier 130. The envelope amplifier 130 powers rails of the RF amplifier 160 to modulate the RF Signal In 110 at the proper power level. This causes the RF amplifier 160 to be run at the most efficient level because the waveform of the RF Signal In 110 is going rail-to-rail. The envelope detector 120 filters out harmonics of the RF Signal In 110 and rectifies the signal to only provide the magnitude of the RF Signal In 110 and drive the supply line providing the dynamic drain voltage 150 to the RF amplifier 160.

Figure 2:
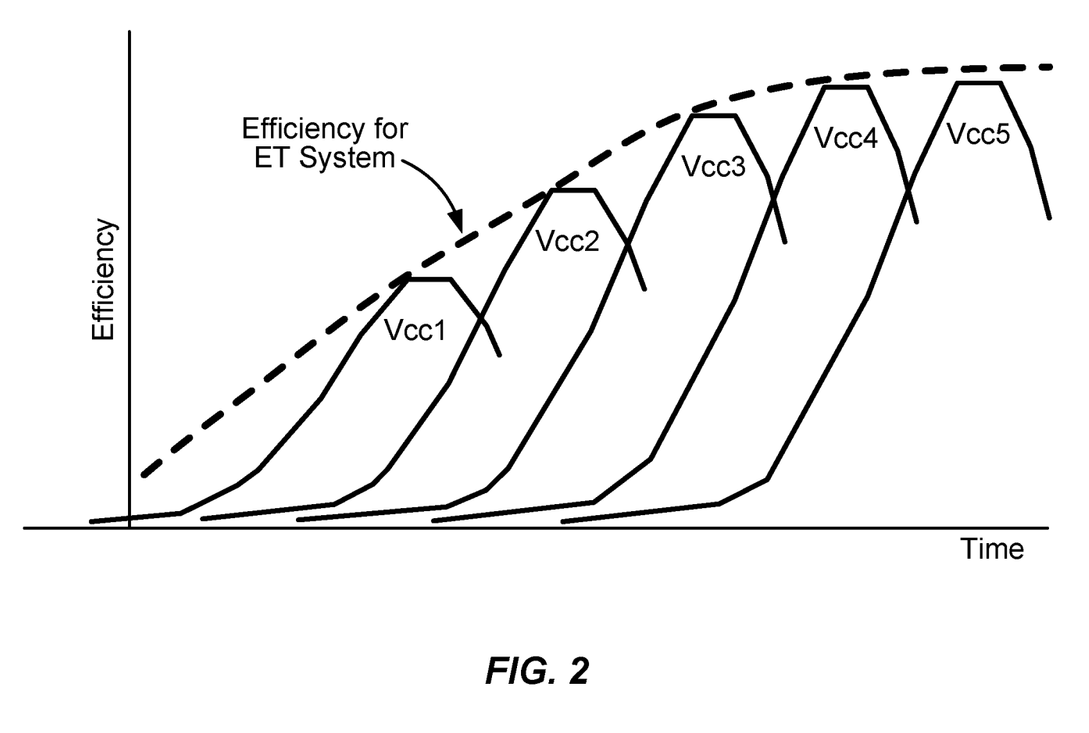
FIG. 2 depicts a performance of a field effect transistor (FET) that, as the Pout voltage rises due to envelope tracking (ET) of the amplifier, the FET modulates an RF amplifier to drive the RF amplifier efficiently.

Envelope tracking affects how the RF amplifier 160 behaves to drive up the efficiency at various output levels. FIG. 2 depicts a performance of a field effect transistor (FET) that, as a Vout voltage rises due to envelope tracking (ET) of the amplifier, the FET modulates the RF amplifier 160 to drive the RF amplifier 160 more efficiently. This is a modulated supply regime. Sometime this is referred to as a dynamic supply or modulated supply for the RF Amplifier 160.

Figure 3:
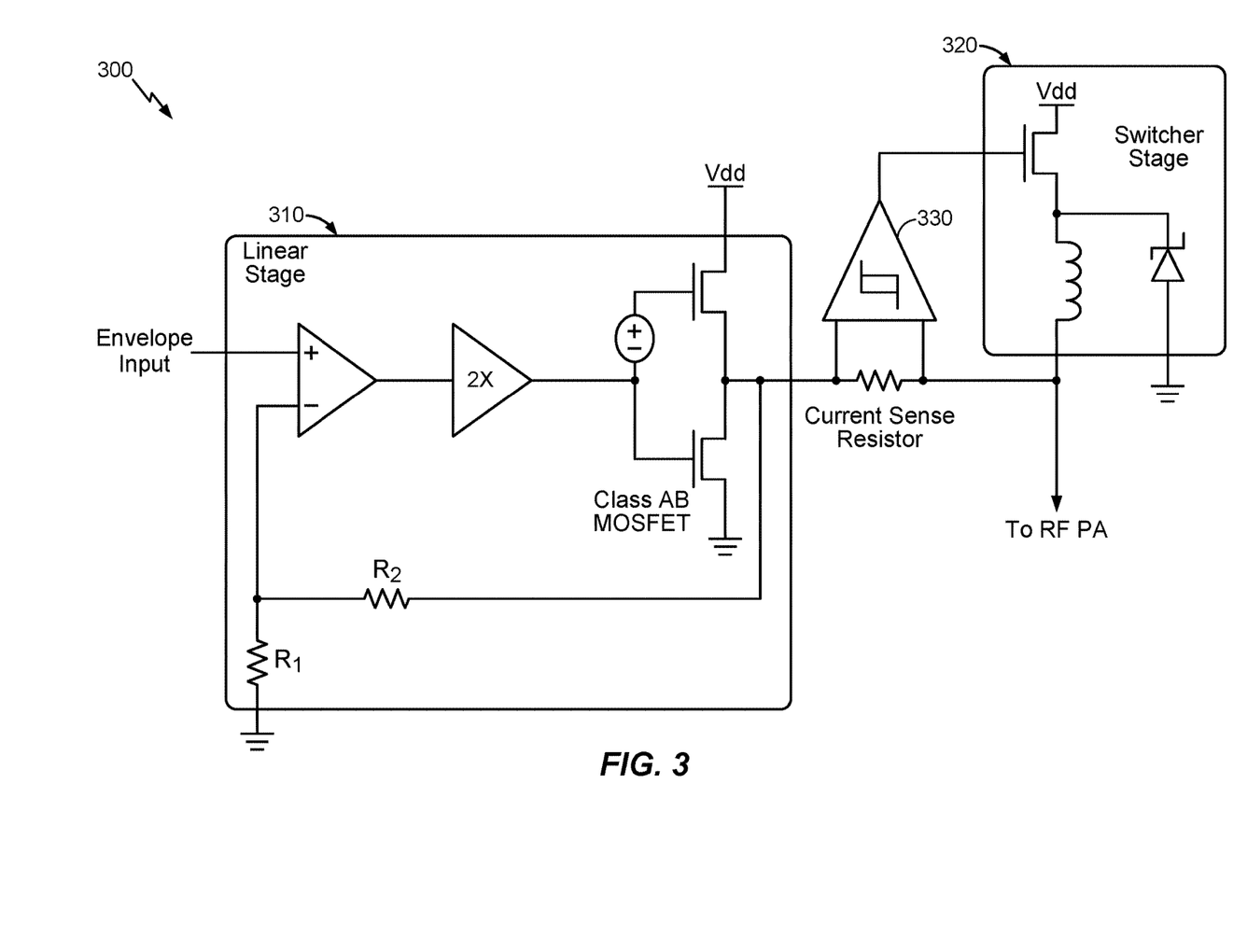
FIG. 3 is a schematic diagram illustrating another exemplary envelope tracking amplifier according to a presently disclosed embodiment.

FIG. 3 is a schematic diagram illustrating another exemplary envelope tracking amplifier 300. The envelope tracking amplifier 300 comprises a linear stage 310 operated in parallel with a switcher stage 320. The linear stage 310 operates as a voltage source with the help of an operational amplifier wrapped in a feedback loop to maintain linearity. The switcher stage 320, essentially designed as an efficiency buck converter, provides a majority of the current to the drain of the RF power amplifier. A current sense resister 330 detects a net current out of the linear stage 310 to control the switching behavior of the switcher stage 320. In addition, the linear stage 310 acts as an auxiliary current source to sink and source any additional necessary current needed to minimize the overall error between the desired current and the current provided by the switcher stage 320. The configuration of envelope tracking amplifier 300, while being fairly efficient for low bandwidth signals, has issues when being applied to very wide bandwidth signals of about 100 MHz or more.

Some power amplifiers may utilize a low dropout (LDO) voltage regulator to modulate the voltage supplied to the RF amplifier of an envelope tracking amplifier. An LDO operates at one voltage and steps down to a lower voltage. If $V_{out}$ is close to $V_{in}$, the LDO may be efficient. If the $V_{out}$ and $V_{in}$ are far apart, the LDO may be inefficient. Use of an LDO in a voltage regulator may also provide low impedance (single digit ohms) even at a high bandwidth. Use of an LDO may provide for fast voltage adjustment, but use of a single LDO may not efficient, especially for high bandwidth signals.

Figure 4:
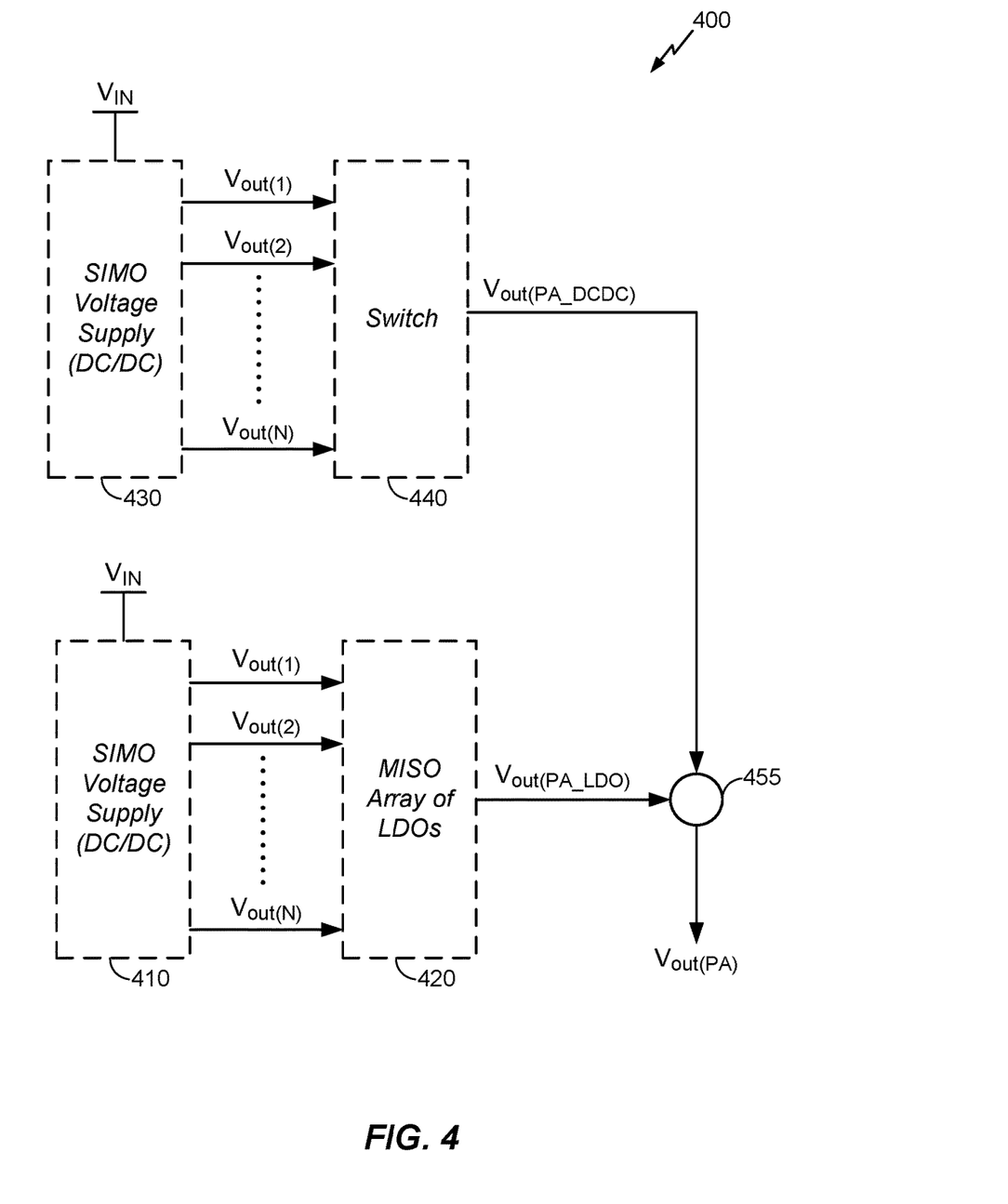
FIG. 4 is a block diagram of an example of an envelope tracking power amplifier that utilizes multiple low dropout regulators (LDOs)

FIG. 4 is a block diagram of an example of an envelope tracking power amplifier 400 that utilizes multiple LDOs. The envelope tracking power amplifier 400 includes a single-input-multiple-output (SIMO) voltage supply 410 and a multi-input-single-output (MISO) array 420 of a plurality of LDOs. The SIMO voltage supply 410 can provide multiple input voltages to the MISO LDO array 420, the voltages in this example varying from a maximum voltage of $V_{out}(1)$ to a minimum voltage of $V_{out}(N)$, with N−2 other voltages $V_{out}(2)$ to $V_{out}(N-1)$ between $V_{out}(1)$ and $V_{out}(N)$.

The voltages provided to the MISO LDO array 420 are chosen to bracket the desired output voltage $V_{out}(PA\_LDO)$ to be provided to a RF power amplifier (shown as $V_{out}(PA)$), for example (See Table 1 below). For example if the desired $V_{out}(PA)$ is between $V_{out}(1)$ and $V_{out}(2)$, the SIMO voltage supply 410 could supply $V_{out}(1)$ as a base voltage (Vdd) to a first LDO and supply $V_{out}(2)$ to a second LDO. Each of the first and second LDOs would receive as an input, the desired $V_{out}(PA)$ voltage and would operate to output the desired output voltage $V_{out}(PA)$. The outputs of the first and second LDOs would be combined with a combiner to form a combined output voltage. The combining could produce a form of averaging of the output voltages through parallel combining such that the combined output voltage is closer to the desired $V_{out}(PA)$ than either the output of the first LDO or the output of the second LDO. In this example, there is an implied ground reference for the first and second LDOs such that each LDO can produce voltages from zero volts to the input voltage $V_{out}(1)$ to $V_{out}(N)$.

As the desired output voltage Vout(PA) to be supplied to the RF amplifier changes, the SIMO voltage supply 410 selectively chooses which output voltage to supply to each of the LDOs in the MISO LDO array 420 as shown in Table 1. For example, if the desired Vout(PA) is between VOUT(2) and VOUT(1), the first LDO receives the VOUT(1) voltage, the second LDO receives the VOUT(2) voltage and these voltages are combined to form VOUT(PA_LDO) which is then output as Vout(PA)

TABLE 1

| DC/DC output: $V_{OUT}(N) < \ldots < V_{OUT}(3) < V_{OUT}(2) < V_{OUT}(1)$ | |
|---|---|
| 1) | When $V_{OUT}(2) < V_{OUT} < V_{OUT}(1)$:<br>First LDO Vdd = $V_{OUT}(1)$<br>Second LDO Vdd = $V_{OUT}(1)$ |
| 2) | When $V_{OUT}(3) < V_{OUT} < V_{OUT}(2)$:<br>First LDO Vdd = $V_{OUT}(1)$<br>Second LDO Vdd = $V_{OUT}(2)$ |
| 3) | When $V_{OUT}(4) < V_{OUT} < V_{OUT}(3)$:<br>First LDO Vdd = $V_{OUT}(3)$<br>Second LDO Vdd = $V_{OUT}(2)$ |
| 4) | When $V_{OUT}(N) < V_{OUT} < V_{OUT}(N-1)$:<br>First LDO Vdd = $V_{OUT}(N-2)$<br>Second LDO Vdd = $V_{OUT}(N-1)$ |
| 5) | When $V_{OUT} < V_{OUT}(N)$:<br>First LDO Vdd = $V_{OUT}(N)$<br>Second LDO Vdd = $V_{OUT}(N-1)$ |

In some embodiments, the envelope tracking power amplifier 400 may optionally include a SIMO voltage supply 430 that selectively provides one of the voltages $V_{out}(1)$ to $V_{out}(N)$ to a switch 440 coupled to the SIMO voltage supply 430 to provide a switched $V_{out}(PA\_DCDC)$ (which is equal to the voltage input to the switch 440) to be combined with the $V_{out}(PA\_LDO)$ at a combiner 455 and the combined voltages are provided as Vout(PA) to the RF power amplifier. The combiner 455 can be similar to the combiner discussed above with reference to the MISO array of LDOs 420. The SIMO voltage supply 430 may be the same voltages supply as the SIMO voltage supply 410.

Figure 5A:
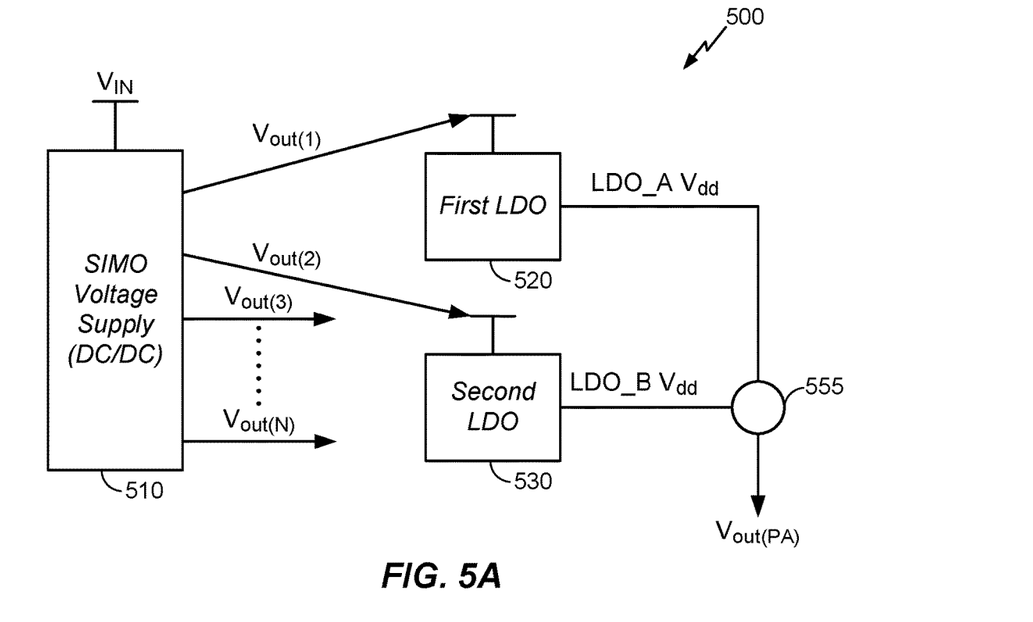
FIGS. 5A and 5B show an exemplary circuit for combining multiple voltages Vout(1) to Vout(N) of a single-input-multi-output (SIMO) voltage supply using multiple LDOs.
Figure 5B:
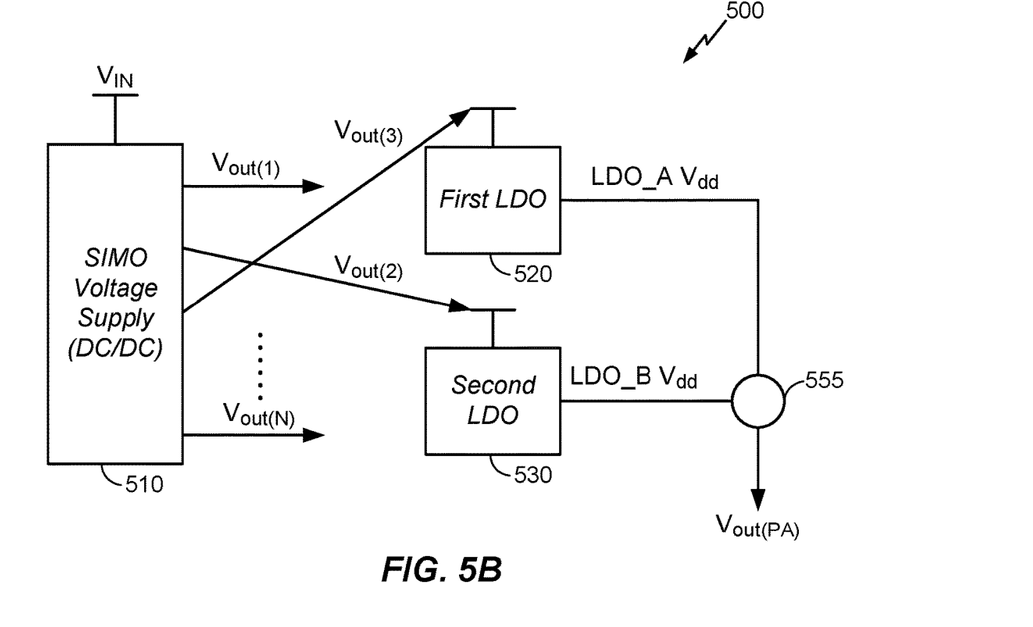

FIGS. 5A and 5B show a circuit 500 for combining multiple voltages Vout(1) to Vout(N) of a SIMO voltage supply using multiple LDOs, a first LDO 520, a second LDO 530 and a combiner 555 in this example. The first LDO 520, the second LDO 530 and the combiner 555 can be part of the MISO array of LDOs 420 described above. In reference to FIG. 4. Other numbers of LDOs may be used to combine the voltages provided by the SIMO voltage supply 510. The circuit 500 can provide a more efficient wide bandwidth supply modulator.

FIG. 5A illustrates a first combining of voltages Vout(1) and Vout(2) at the combiner 555 to provide an output voltage Vout(PA) between Vout(1) and Vout(2). FIG. 5B illustrates a second combining of Vout(2) with Vout(3) at the combiner 555 to provide an output voltage Vout(PA) between Vout(2) and Vout(3). In this example, the Vout(2) voltage remains as the input to the second LDO 530 and the Vout(3) voltage replaces the Vout(1) voltage as the input to the first LDO 520.

Table 2 shows how input voltages to the first LDO 520 and the second LDO 530 change for different output voltages Vout(PA). This configuration of SIMO voltage supply 510 including first and second LDOs 520 and 530 makes for a smoother transition between voltages and can save power. This is a form of a soft handoff of voltages that may result in a smoother transition from one voltage to another. This can continue as the voltage requirement changes. There is an implied ground reference in the LDO that the LDO can go from Vout(1) to zero.

TABLE 2

DC/DC output: $V_{OUT}(N) < \ldots < V_{OUT}(3) < V_{OUT}(2) < V_{OUT}(1)$

1)  When $V_{OUT}(2) < V_{OUT} < V_{OUT}(1)$:
    First LDO 520 Vdd = $V_{OUT}(1)$
    Second LDO 530 Vdd = $V_{OUT}(1)$
2)  When $V_{OUT}(3) < V_{OUT} < V_{OUT}(2)$:
    First LDO 520 Vdd = $V_{OUT}(1)$
    Second LDO 530 Vdd = $V_{OUT}(2)$
3)  When $V_{OUT}(4) < V_{OUT} < V_{OUT}(3)$:
    First LDO 520 Vdd = $V_{OUT}(3)$
    Second LDO 530 Vdd = $V_{OUT}(2)$
4)  When $V_{OUT}(N) < V_{OUT} < V_{OUT}(N-1)$:
    First LDO 520 Vdd = $V_{OUT}(N-2)$
    Second LDO 530 Vdd = $V_{OUT}(N-1)$
5)  When $V_{OUT} < V_{OUT}(N)$:
    First LDO Vdd = $V_{OUT}(N)$
    Second LDO Vdd = $V_{OUT}(N-1)$ Table 3 illustrates an improvement in efficiency that may be afforded using multiple LDOs, each providing a different voltage level. As shown, using a single LDO voltage level to provide for a 1 W DC power output requires 2.48 W, whereas adding second, third and fourth LDOs gradually decreases to power requirement as shown in Table 3.

TABLE 3

| Number of LD 0 s | Power Consumption for 1 W DC Power |
| --- | --- |
| 1 Voltage Level | 2.48 W |
| 2 Voltage Levels | 1.31 W |
| 3 Voltage Levels | 1.22 W |
| 4 Voltage Levels | 1.16 W |

Figure 6A:
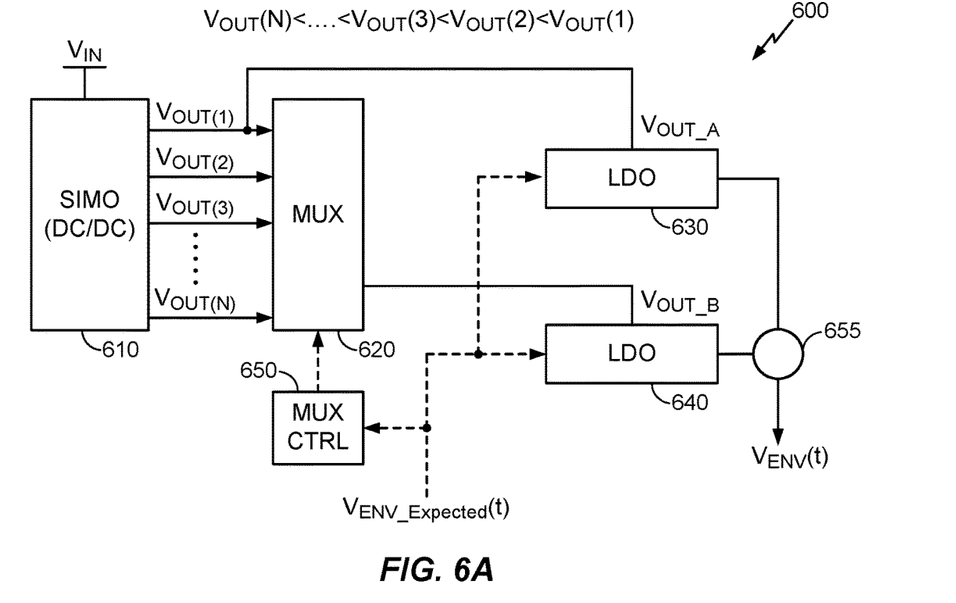
FIGS. 6A, 6B and 6C illustrate components of another exemplary circuit that provides for multiple LDO supplied voltages.
Figure 6B:
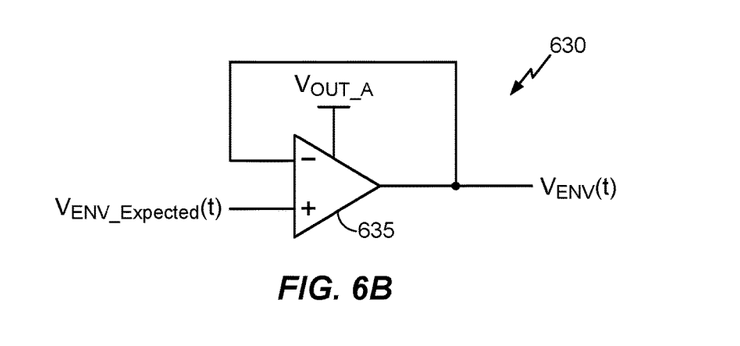
Figure 6C:
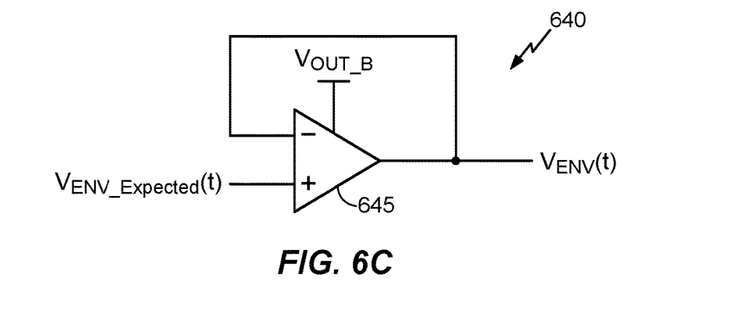

FIGS. 6A, 6B and 6C illustrate components of another exemplary circuit 600 that provides a multiple LDO voltage source including a SIMO (DC/DC) voltage source 610, a multiplexer 620, a first LDO 630, a second LDO 640, a multiplexer controller 650 and a combiner 655. The SIMO voltage supply 610 to provides multiple voltage signals Vout(1), Vout(2), Vout(3) through Vout(N) to the multiplexer 620. The multiplexer 620 may be part of the SIMO voltage supply 610. The multiplexer controller 650 controls the multiplexer 620 to connect one of the multiple voltage signals Vout(1), Vout(2), Vout(3) through Vout(N) to the second LDO 640. The first voltage Vout(1), which has the highest voltage of the N voltage levels is connected to the first LDO 630 which, when controlled by the multiplex controller 650, outputs a first voltage level Vout_A. All N voltage levels are supplied to the multiplexer 620 which connects one of the voltage levels to the second LDO 640 as determined by the multiplexer controller 650. The second LDO 640 outputs a second voltage level Vout_B.

The voltages Vout_A and Vout_B are combined at the combiner 655 to form an envelope tracking voltage Venv(t). The Venv(t) voltage may be between the Vout_A and Vout_B voltage levels or below both of them. When Venv(t) transitions below both voltages Vout_A and Vout_B, the multiplexer 650 disconnects the voltage Vout_B from the second LDO 640 and connects a voltage level less than the desired output Venv(t) to the second LDO 640. The output voltage is determined by an input Venv_Expected provided to the multiplexer controller 650 where Venv_Expected is indicative of the desired output voltage level. The multiplexer controller 650 provides the Venv_Expected input to the multiplexer 620 as well as the first LDO 630 and the second LDO 640.

The first LDO 630 and the second LDO 640 use the Venv_Expected input to control their output voltages Vout_A and Vout_B, respectively. FIG. 6B shows an exemplary circuit of the first LDO 630. The circuit of FIG. 6B includes an operational amplifier (op-amp) 635 that is powered by the Vout_B voltage and receives the desired voltage Venv_Expected from the multiplexer controller 650. The op-amp 635 uses a feedback loop in order to converge on the Venv_Expected input to track the changing Venv_Expected voltage received from the multiplexer controller 650.

FIG. 6C shows an exemplary circuit of the second LDO 640. The circuit of FIG. 6C includes an operational amplifier (op-amp) 645 that is powered by the Vout_B voltage and receives the desired voltage Venv_Expected from the multiplexer controller 650. The op-amp 640 uses a feedback loop in order to converge on the Venv_Expected input to track the changing Venv_Expected voltage received from the multiplexer controller 650. The voltages Vout_A and Vout_B are combined to form the Venv(t) output voltage which will be close to the Venv_Expected voltage level, but at a higher impedance and power level.

In an ideal case, the op-amps 635 and 645 have infinite gain and the plus and minus terminals have the same voltage. However there is some variance in actual circuits. The first LDO 630 and second LDO 640 are buffering amplifiers that track the input signal Venv_expected(t). The Venv_expected(t) may be provided by a modem or an envelope detector circuit, but the source is not critical to the present disclosure.

The multiplexer controller 650 controls logic controlling the voltages provided by the multiplexer 620 to the second LDO 640. If the desired Vout(t) is rising, the Vout_B voltage may be increased and if the desired Vout(t) is falling, the Vout_B voltage may be decreased. The multiplexer controller 650 may employ a predictive analysis to better predict future desired Vout(t) voltages. In one embodiment, the second LDO 640 may function as the primary LDO and the first LDO 630 may function as a backup LDO.

In various embodiments, the first LDO 630 and the second LDO 640 could be different sized LDOs or the same size LDOs. Different sized LDOs may provide capabilities for the larger LDO providing higher current and higher voltages to devices that need higher currents while the other LDO could provide smaller currents at smaller voltages to devices capable of using smaller currents. This configuration may improve the efficiency of the system. In some embodiments, there may be more than two LDOs. In additions, systems could use segmented LDOs where different portions of the LDOs are activated when needed.

Table 4 shows how input voltages to the first LDO 630 and the second LDO 640 change for different output voltages Vout(PA). For Example, if a 4 level SIMO voltage supply is used, the efficiency of the envelop modulator (600) can be up to 86% efficiency for LTE signals.

TABLE 4

DC/DC output: $V_{OUT}(N) < \ldots < V_{OUT}(3) < V_{OUT}(2) < V_{OUT}(1)$

Figure 7:
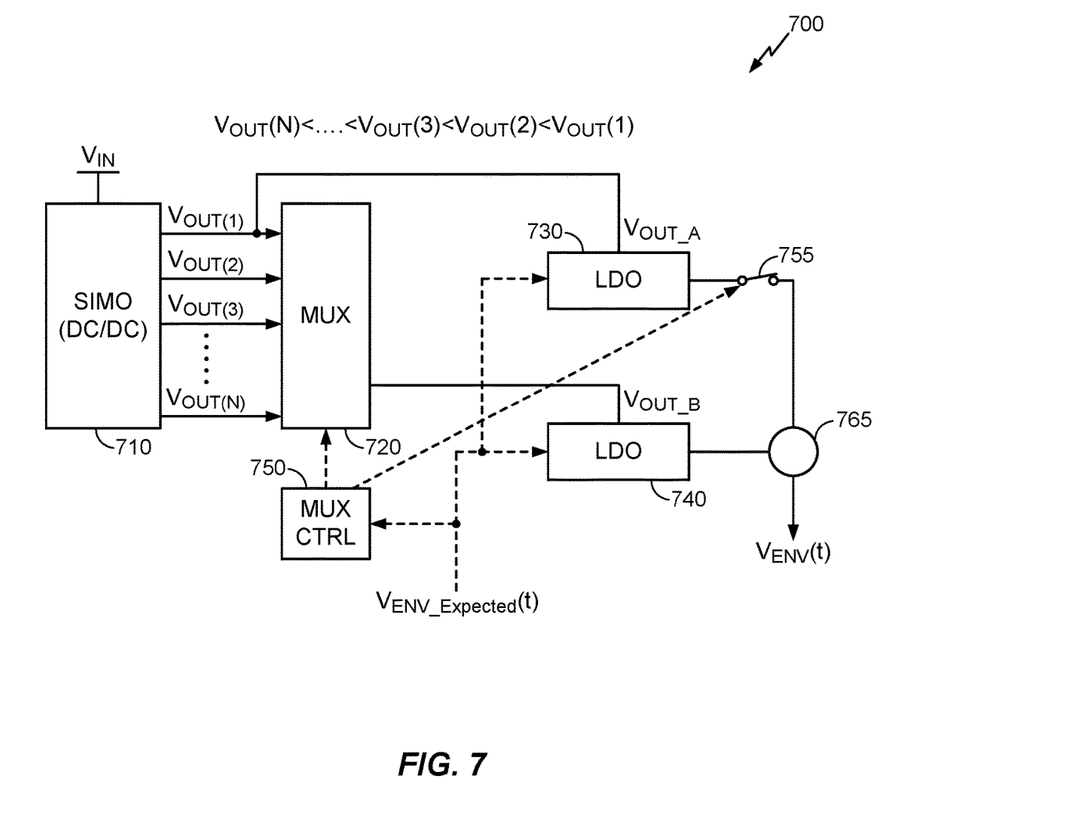
FIG. 7 illustrates components of another exemplary circuit that provides for multiple LDO supplied voltages.

First LDO 630 Vdd: $V_{OUT}(1)$
Second LDO 640 Vdd: MISO Mux Output
1. When $V_{OUT}(2) < V_{OUT} < V_{OUT}(1)$:
    First LDO 640 Vdd: $V_{OUT}(1)$
2. When $V_{OUT}(3) < V_{OUT} < V_{OUT}(2)$:
    Second LDO 640 Vdd = $V_{OUT}(2)$
3. When $V_{OUT}(4) < V_{OUT} < V_{OUT}(3)$:
    Second LDO 640 Vdd = $V_{OUT}(3)$
4. When $V_{OUT}(N) < V_{OUT} < V_{OUT}(N-1)$:
    Second LDO 640 Vdd = $V_{OUT}(N-1)$
5. When $V_{OUT} < V_{OUT}(N)$:
    Second LDO 640 Vdd = $V_{OUT}(N)$ FIG. 7 illustrates components of another exemplary circuit 700 that provides for multiple LDO supplied voltages. The circuit 700 includes a SIMO voltage supply 710, a multiplexer 720, a first LDO 730, a second LDO 740, a multiplexer controller 750, a switch 755 and a combiner 765.

The SIMO 710, the multiplexer 720, the first LDO 730, the second LDO 740 and the combiner 765 can be similar to the corresponding components illustrated in FIGS. 6A, 6B and 6C discussed above. One difference between the circuit 700 and the circuit 600 is the presence of the switch 755. The switch 755 is controlled by the multiplexer controller 750 to activate and deactivate the first LDO 730. The switch 755 may be controlled to activate the first LDO 730 when the second LDO 740 is transitioning to a new voltage level Vout_B, as determined by the input Venv_expected(t).

When the first LDO 730 has been activated and is to be deactivated, the second LDO 740 may be powered up prior to deactivating the first LDO 730. In addition, the first LDO 730 may be activated when the second LDO 740 is transitioning to a new voltage level. The configuration of the circuit 700 provides benefits including conserving energy when the first LDO 730 or the second LDO 740 is deactivated and preventing the first LDO 730 from loading the second LDO 740, and vice-versa. This provides for more efficient performance. If one LDO is loading another LDO, it is beneficial to reduce the loading. In addition deactivation one of the first LDO 730 and the second LDO 740 reduces the capacitance of the circuit 700, further improving efficiency. The speed of the Venv_expected(t) input affects the capacitance and may be slowed to reduce the capacitance of the circuit 700.

In one embodiment, the first LDO 730 is operated at a same or higher voltage (Vout(1) in this example) than the second LDO 740 in order to provide insurance that enough voltage is available to meet demand. In addition, the first LDO 730 is not adversely affected when the second LDO 740 is transitioning to a new voltage because the first LDO 730 is operating at the higher voltage. The first LDO 730 and the second LDO 740 receive the same input Venv_expected(t) and therefore output the same voltage.

Figure 8:
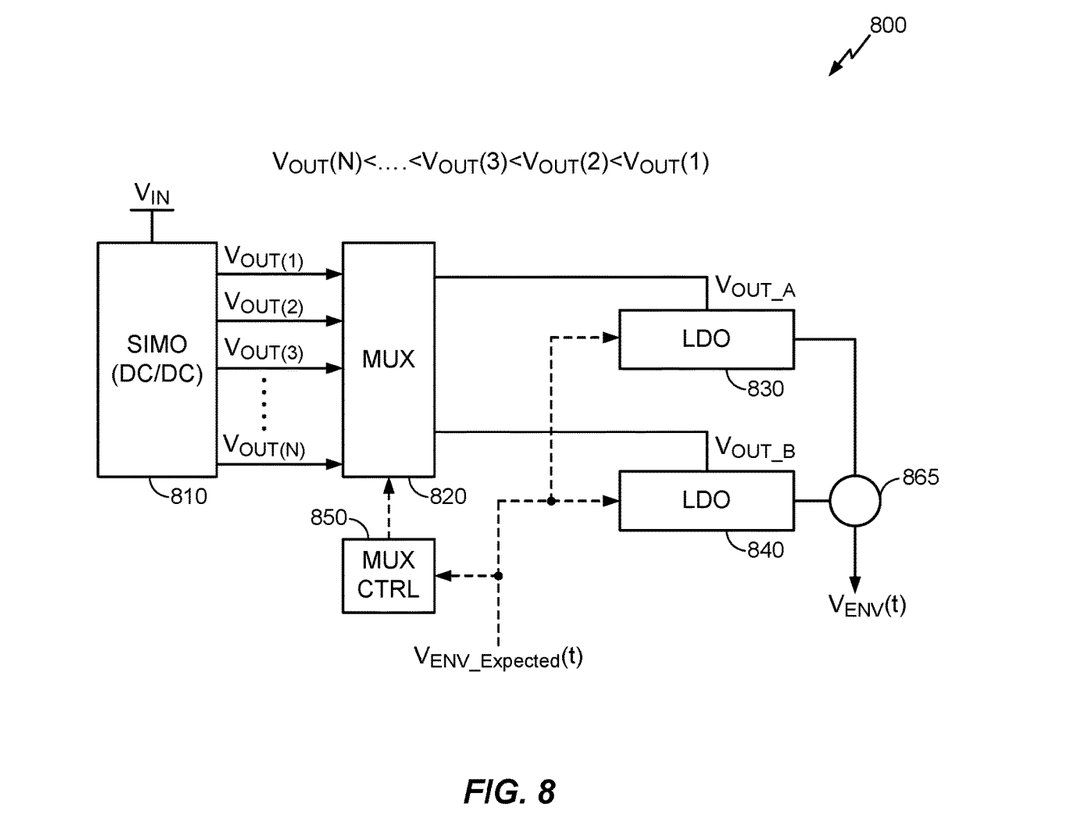
FIG. 8 illustrates components of another exemplary circuit that provides for multiple LDO supplied voltages.

FIG. 8 illustrates components of another exemplary circuit 800 that provides for multiple LDO supplied voltages. The circuit 800 includes a SIMO voltage supply 810, a multiplexer 820, a first LDO 830, a second LDO 840, a multiplexer controller 850 and a combiner 865.

The SIMO 810, the multiplexer 820, the first LDO 830, the second LDO 840 and the combiner 865 can be similar to the corresponding components illustrated in FIGS. 6A, 6B, 6C and 7 discussed above. One difference between the circuit 900 and the circuits 600 and 700 is that the multiplexer controller 850 controls the first LDO 830 and the second LDO 840 to operate simultaneously in a dual LDO mode. Each of the first LDO 830 and the second LDO 840 may be controlled by the multiplexer controller 850 to operate at the same voltage or at different voltages from Vout(1) to Vout(N), as determined by the input Venv_expected(t). By operating the first LDO 830 and the second LDO 840 simultaneously, redundant voltage signals are provided.

Figure 9:
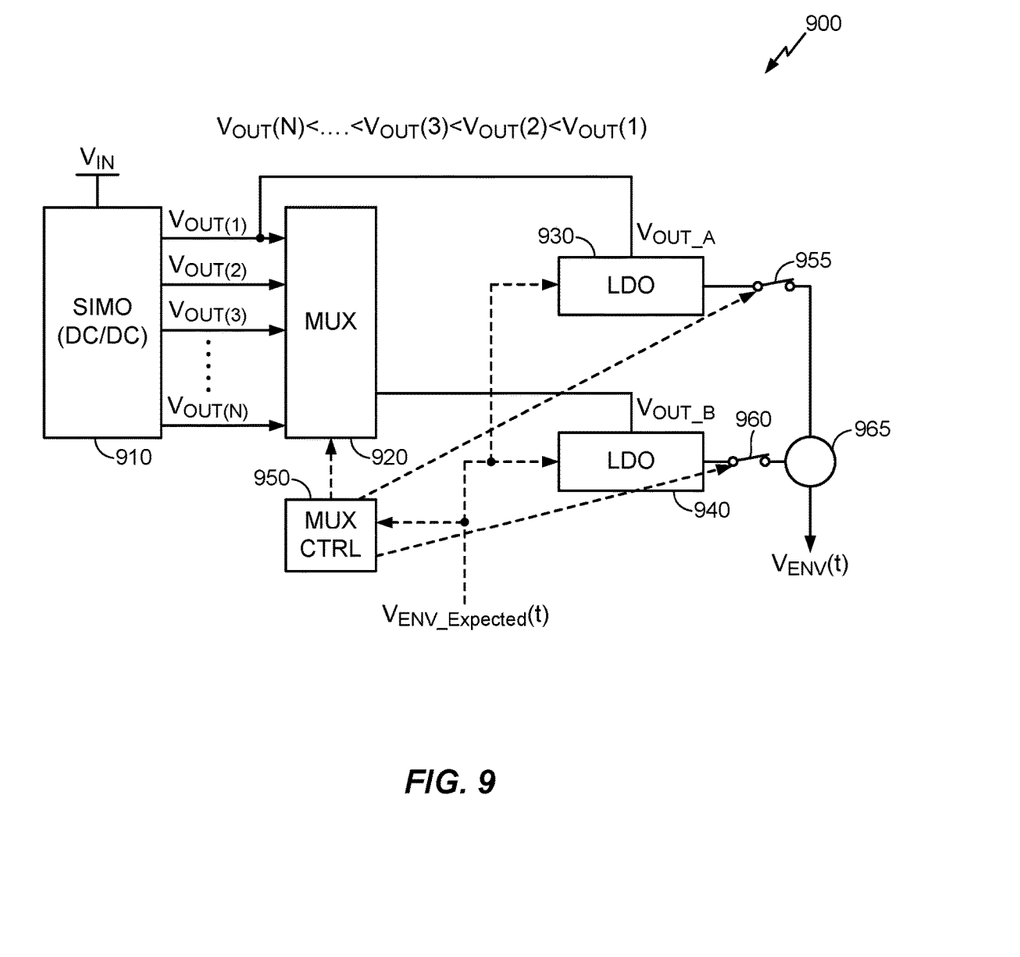
FIG. 9 illustrates components of another exemplary circuit that provides for multiple LDO supplied voltages.

FIG. 9 illustrates components of another exemplary circuit 900 that provides for multiple LDO supplied voltages. The circuit 900 includes a SIMO voltage supply 910, a multiplexer 920, a first LDO 930, a second LDO 940, a multiplexer controller 950 and a combiner 965. The SIMO 910, the multiplexer 920, the first LDO 930, the second LDO 940 and the combiner 965 can be similar to the corresponding components illustrated in FIGS. 6A, 6B, 6C, 7 and 8 discussed above. In this configuration the multiplexer controller 950 can control switches 955 and 960 to activate and deactivate either the first LDO 930 and/or the second LDO 940 to provide any voltage with either one or both of the first LDO 930 and the second LDO 940. Such a configuration provides a large number of possible voltage levels which can be advantageous.

Figure 10:
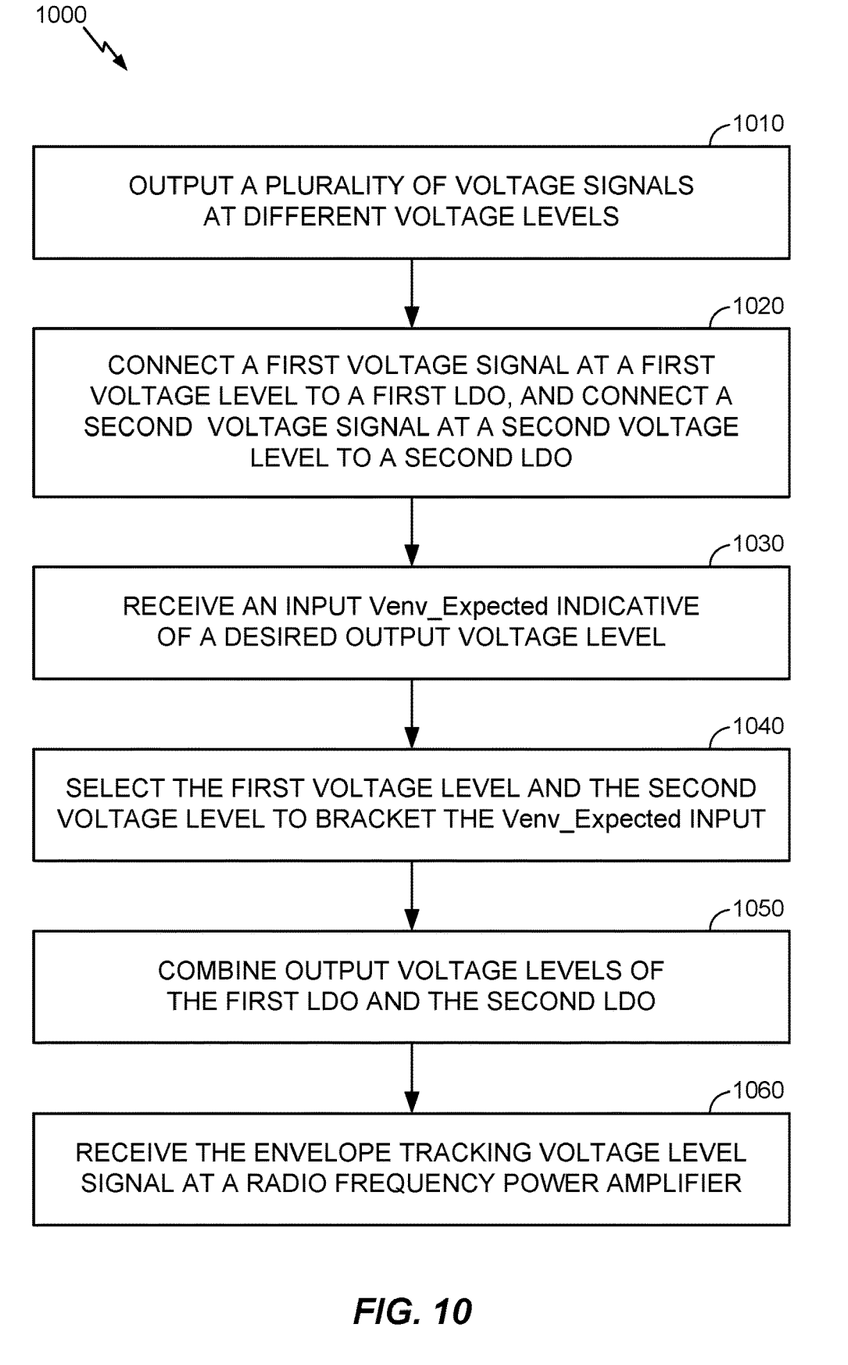
FIG. 10 is a flowchart of an exemplary process for operating a wideband envelope tracking power amplifier.

FIG. 10 is a flowchart of a process 1000 for operating a wideband envelope tracking power amplifier. The process 1000 of may be performed with any suitable circuit (e.g., any of the circuits of FIGS. 4-9) however, to provide a specific example, the process 1000 will be described with reference to the circuit of FIG. 9.

In block 1010, The SIMO voltage source 910 outputs a plurality of voltage signals at different voltage levels. The voltage levels include a highest voltage level Vout(1) and a plurality of other voltage levels Vout(2) to Vout(N) lower than the highest voltage level. In block 1020, the multiplexer 920 connects a first of the plurality of voltage signals at a first voltage level to the first LDO 930, and connects a second of the plurality of voltage signals at a second voltage level to the second LDO 940. The first voltage level and the second voltage level bracket a desired output voltage level, Venv_Expected, and output voltage levels of the first LDO and the second LDO are combined to form an envelope tracking voltage level signal Venv(t).

In block 1030, the multiplexer controller 950 receives the input Venv_Expected indicative of the desired output voltage level. In block 1040, the multiplexer controller 950 provides the Venv_Expected input to the multiplexer 920 and the multiplexer 920 selects the first voltage level and the second voltage level to bracket the Venv_Expected input. The multiplexer controller 950 also provides the Venv_Expected input to the first LDO 930 and the second LDO 940 such that the operational amplifiers of the first LDO and the second LDO converge on the Venv_Expected input. The first LDO 930 and the second LDO 940 may each include an operational amplifier with a feedback loop.

In block 1050, the combiner 965 combines output voltages of the first LDO 930 and the second LDO 940 to form an envelope tracking voltage level signal. In block 1060, a radio frequency power amplifier receives the envelope tracking voltage level signal. The envelope tracking voltage level signal causes the radio frequency power amplifier to be driven rail-to-rail.

The process 1000 continues as the desired output voltage level changes, as indicated by changes in the Venv_Expected input received in block 1030. For example, the multiplexer 920 may connect a third of the plurality of voltage signals to the first LDO in order to bracket a changing desired voltage level.

The process 1000 may be embodied on a non-transitory computer readable medium contained in any or all of circuit block in FIGS. 4-9, or other non-transitory computer readable medium known to those of skill in the art, having stored therein a program including computer executable instructions for making a processor, computer, or other programmable device execute the operations of the methods. The order of the blocks in the process 1000 may be changed and/or omitted without departing from the scope of the process 1000.

Although particular embodiments are described above, many variations of the disclosure are possible, including, for example, those with different transistor types, with different biasing arrangements, or with additional amplification stages. Additionally embodiments have been described for CMOS technology but similar circuits may be used with other technologies. Additionally, features of the various embodiments may be combined in combinations that differ from those described above.

The above description of the disclosed embodiments is provided to enable any person skilled in the art to make or use the disclosure. Various modifications to these embodiments will be readily apparent to those skilled in the art, and the generic principles described herein can be applied to other embodiments without departing from the spirit or scope of the disclosure. Thus, it is to be understood that the description and drawings presented herein represent presently preferred embodiments of the disclosure and are therefore representative of the subject matter which is broadly contemplated by the present disclosure. It is further understood that the scope of the present disclosure fully encompasses other embodiments that may become obvious to those skilled in the art and that the scope of the present disclosure is accordingly limited by nothing other than the appended claims.

What is claimed is:

1. A wideband envelope tracking power amplifier comprising:
   a plurality of low dropout voltage regulators (LDOs) including at least a first LDO and a second LDO;
   a single-input-multi-output (SIMO) voltage supply configured to:
      output a plurality of voltage signals at different voltage levels, the voltage levels including a highest voltage level and one or more voltage levels lower than the highest voltage level, wherein each of plurality of voltage signals is switchably connected to at least one of the first LDO or second LDO;
      connect the first LDO to a first voltage signal at a first voltage level to form at least a portion of an envelope tracking voltage level signal, the first voltage signal is one of the plurality of voltage signals; and
      connect the second LDO to at least one of (i) the first voltage signal or (ii) a second of the plurality of voltage signals at a second voltage level less than the first voltage level to form at least another portion of the envelope tracking voltage level signal, the second voltage signal selected from the plurality of voltage signals based on a desired output voltage level.

2. The wideband envelope tracking power amplifier of claim 1, wherein the first voltage level is greater than or equal to the desired output voltage level; and
   wherein the second voltage level is less than or equal to the desired output voltage level.

3. The wideband envelope tracking power amplifier of claim 1, further comprising a combiner configured to combine output voltage levels of the first LDO and the second LDO to form the envelope tracking voltage level signal.

4. The wideband envelope tracking power amplifier of claim 3, further comprising:
   a multiplexer configured to receive the plurality of voltage signals from the SIMO voltage supply;
   a multiplexer controller configured to
      receive an input signal indicative of the desired output voltage level; and
      provide the input signal to the multiplexer such that the multiplexer can select the first voltage level and the second voltage level to bracket the desired output voltage level indicated by the input signal.

5. The wideband envelope tracking power amplifier of claim 4, wherein the first LDO and the second LDO each comprises an operational amplifier with a feedback loop and the multiplexer controller is further configured to:
   provide the input signal to the first LDO and the second LDO such that the operational amplifiers of the first LDO and the second LDO converge on the input signal.

6. The wideband envelope tracking power amplifier of claim 5, further comprising:
   a first switch connected to an output of the first LDO, wherein the multiplexer controller is further configured to control the first switch to activate and deactivate the first LDO.

7. The wideband envelope tracking power amplifier of claim 6, further comprising:
   a second switch connected to an output of the second LDO, wherein the multiplexer controller is further configured to control the second switch to activate and deactivate the second LDO.

8. The wideband envelope tracking power amplifier of claim 1, wherein the SIMO voltage supply is further configured to connect a third of the plurality of voltage signals to the first LDO in order to bracket a changing desired output voltage level.

9. The wideband envelope tracking power amplifier of claim 3, further comprising:
   a switch coupled to the SIMO voltage supply;
   wherein the SIMO voltage supply is further configured to connect a third voltage signal of the plurality of voltage signals to the switch and the switch is configured to connect the third voltage signal with the envelope tracking voltage level signal to be combined with the envelope tracking voltage level signal at the combiner.

10. The wideband envelope tracking power amplifier of claim 1, further comprising a radio frequency power amplifier configured to receive the envelope tracking voltage level signal.

11. A wideband envelope tracking power amplifier comprising:
  a plurality of low dropout voltage regulators (LDOs) including at least a first LDO and a second LDO;
  a single-input-multi-output (SIMO) voltage supply configured to:
    output a plurality of voltage signals at different voltage levels, the voltage levels including a highest voltage level and a plurality of voltage levels lower than the highest voltage level, wherein each of the plurality of voltage signals is switchably connected to at least one of the first LDO or second LDO, and wherein the first LDO receives a first voltage signal of the plurality of voltage signals at a first voltage level, the first voltage level comprising the highest voltage level; and
    connect the second LDO to at least one of (i) the first voltage signal or (ii) a second of the plurality of voltage signals at a second voltage level, the second voltage level being less than the first voltage level, the second voltage signal selected from the plurality of voltage signals based on a desired output voltage level; and
  a combiner configured to combine output voltage levels of the first LDO and the second LDO to form an envelope tracking voltage level signal.

12. The wideband envelope tracking power amplifier of claim 11, wherein the first voltage level and the second voltage level bracket the desired output voltage level.

13. The wideband envelope tracking power amplifier of claim 12, wherein the SIMO voltage supply comprises a multiplexer configured to receive the plurality of voltage signals from the SIMO voltage supply, the wideband envelope tracking power amplifier further comprising:
  a multiplexer controller configured to
    receive an input signal indicative of the desired output voltage level; and
    provide the input signal to the multiplexer such that the multiplexer can select the first voltage level and the second voltage level to bracket the desired output voltage level indicated by the input signal.

14. The wideband envelope tracking power amplifier of claim 13, further comprising:
  a switch connected to an output of the first LDO, wherein the multiplexer controller is further configured to control the switch to activate and deactivate the first LDO.

15. The wideband envelope tracking power amplifier of claim 14, wherein the multiplexer controller is further configured to:
  activate the first LDO with the switch while the second LDO is transitioning to a new voltage level.

16. The wideband envelope tracking power amplifier of claim 15, wherein the multiplexer controller is further configured to:
  deactivate the first LDO with the switch after the second LDO has transitioned to the new voltage level.

17. The wideband envelope tracking power amplifier of claim 13, wherein the first LDO and the second LDO each comprises an operational amplifier with a feedback loop and the multiplexer controller is further configured to:
  provide the input signal to the first LDO and the second LDO such that the operational amplifiers of the first LDO and the second LDO converge on the desired output voltage level indicated by the input signal.

18. The wideband envelope tracking power amplifier of claim 11, wherein the envelope tracking voltage level signal causes a radio frequency power amplifier to be driven rail-to-rail.

19. The wideband envelop tracking power amplifier of claim 11, wherein the SIMO voltage supply is further configured to connect a third of the plurality of voltage signals to the second LDO in order to bracket a changing desired output voltage level.

20. The wideband envelope tracking power amplifier of claim 11, further comprising:
  a switch coupled to the SIMO voltage supply;
  wherein the SIMO voltage supply is further configured to connect a third voltage signal of the plurality of voltage signals to the switch and the switch is configured to connect the third voltage signal with the envelope tracking voltage level signal to be combined with the envelope tracking voltage level signal at the combiner.

21. The wideband envelope tracking power amplifier of claim 11, further comprising a radio frequency power amplifier configured to receive the envelope tracking voltage level signal.

22. A method for operating a wideband envelope tracking power amplifier, the method comprising:
  outputting a plurality of voltage signals at different voltage levels, the voltage levels including a highest voltage level and one or more voltage levels lower than the highest voltage level, each of the plurality of voltage signals switchably connectable to at least one of the first LDO or second LDO;
  connecting a first voltage signal at a first voltage level to a first low dropout voltage regulator (LDO), the first voltage signal is one of the plurality of voltage signals;
  connecting a second of the plurality of voltage signals at a second voltage level to a second LDO, the second voltage level being less than or equal to the highest voltage level, the second voltage signal selected from the plurality of voltage signals based on a desired output voltage level; and
  combining output voltage levels of the first LDO and the second LDO to form an envelope tracking voltage level signal.

23. The method of claim 22, further comprising:
  receiving an input signal indicative of the desired output voltage level; and
  selecting the first voltage level and the second voltage level to bracket the desired output voltage level indicated by the input signal.

24. The method of claim 23, wherein the first LDO and the second LDO each comprises an operational amplifier with a feedback loop, the method further comprising:
  providing the input signal to the first LDO and the second LDO such that the operational amplifiers of the first LDO and the second LDO converge on the input signal.

25. The method of claim 22, further comprising connecting a third of the plurality of voltage signals to the first LDO in order to bracket a changing desired voltage level.

26. The method of claim 22, further comprising receiving the envelope tracking voltage level signal at a radio frequency power amplifier wherein the envelope tracking voltage level signal causes the radio frequency power amplifier to be driven rail-to-rail.

27. A wideband envelope tracking power amplifier comprising:
  a means for outputting a plurality of voltage signals at different voltage levels, the voltage levels including a highest voltage level and a plurality of voltage levels lower than the highest voltage level, each of the plurality of voltage signals switchably connectable to at least one of the first LDO or second LDO;

a means for connecting a first voltage signal at a first voltage level to a first low dropout voltage regulator (LDO), the first voltage signal I one of the plurality of voltage signals, and for connecting a second of the plurality of voltage signals at a second voltage level less than or equal to the highest voltage level to a second LDO, the second voltage signal selected from the plurality of voltage signals based on a desired output voltage level; and a means for combining output voltage levels of the first LDO and the second LDO to form an envelope tracking voltage level signal.

28. The wideband envelope tracking power amplifier of claim 27, further comprising:

a means for receiving an input signal indicative of the desired output voltage level; and a means for selecting the first voltage level and the second voltage level to bracket the desired output voltage level indicated by the input signal.

29. The wideband envelope tracking power amplifier of claim 28, wherein the first LDO and the second LDO each comprises an operational amplifier with a feedback loop, the method further comprising:

a means for providing the input signal to the first LDO and the second LDO such that the operational amplifiers of the first LDO and the second LDO converge on the input signal.

30. The wideband envelope tracking power amplifier of claim 27, further comprising a radio frequency power amplifier means for receiving the envelope tracking voltage level signal wherein the envelope tracking voltage level signal causes the radio frequency power amplifier means to be driven rail-to-rail.

* * * * *